United States Patent
Baba

(10) Patent No.: US 11,821,103 B2
(45) Date of Patent: Nov. 21, 2023

(54) QUARTZ GLASS CRUCIBLE

(71) Applicant: SHIN-ETSU QUARTZ PRODUCTS CO., LTD., Tokyo (JP)

(72) Inventor: Yuji Baba, Takefu (JP)

(73) Assignee: SHIN-ETSU QUARTZ PRODUCTS CO., LTD., Tokyo (JP)

(*) Notice: Subject to any disclaimer, the term of this patent is extended or adjusted under 35 U.S.C. 154(b) by 145 days.

(21) Appl. No.: 17/267,283

(22) PCT Filed: Jun. 4, 2019

(86) PCT No.: PCT/JP2019/022168
§ 371 (c)(1),
(2) Date: Feb. 9, 2021

(87) PCT Pub. No.: WO2020/031481
PCT Pub. Date: Feb. 13, 2020

(65) Prior Publication Data
US 2021/0310151 A1  Oct. 7, 2021

(30) Foreign Application Priority Data
Aug. 9, 2018 (JP) .................. 2018-150790

(51) Int. Cl.
*C30B 15/10* (2006.01)
*C30B 35/00* (2006.01)

(52) U.S. Cl.
CPC ............ *C30B 15/10* (2013.01); *C30B 35/002* (2013.01)

(58) Field of Classification Search
CPC ....... C03B 19/095; C03B 20/00; C30B 15/10; C30B 29/06
See application file for complete search history.

(56) References Cited

U.S. PATENT DOCUMENTS

| 2005/0178319 A1 | 8/2005 | Korus et al. |
| 2010/0107970 A1 | 5/2010 | Kodama et al. |
| 2012/0037069 A1* | 2/2012 | Sudo ..................... C03B 19/095 65/17.6 |

FOREIGN PATENT DOCUMENTS

| CN | 101724887 A | 6/2010 |
| JP | H10-182139 A | 7/1998 |

(Continued)

OTHER PUBLICATIONS

Jul. 5, 2022 Office Action and Search Report issued in Singapore Patent Application No. 11202101068V.

(Continued)

*Primary Examiner* — Hua Qi
(74) *Attorney, Agent, or Firm* — Oliff PLC

(57) ABSTRACT

A quartz glass crucible including a bottom portion, a curved portion, and a straight body portion, where the quartz glass crucible includes an outer layer including opaque quartz glass containing bubbles therein, and an inner layer including transparent quartz glass, the outer layer includes a plurality of layers in a part of the straight body portion, out of the plurality of layers, one layer having a devitrification spot number of 50/cm$^3$ or more and 70/cm$^3$ or less when the quartz glass crucible is heated at 1600° C. for 24 hours, and a layer positioned inwards of the devitrifiable layer in a thickness direction of the quartz glass crucible is a low devitrification layer having a spot number of 2/cm$^3$ or less when the quartz glass crucible is heated at 1600° C. for 24 hours. This provides a quartz glass crucible suppressed from deformation due to heating and excessive progression of devitrification.

16 Claims, 3 Drawing Sheets

(56) References Cited

FOREIGN PATENT DOCUMENTS

| | | | |
|---|---|---|---|
| JP | H10-203893 A | | 8/1998 |
| JP | 2000-072589 A | | 3/2000 |
| JP | 2000-247778 A | | 9/2000 |
| JP | 2005-523229 A | | 8/2005 |
| JP | 2008-081374 A | | 4/2008 |
| JP | 2009-084085 A | | 4/2009 |
| JP | 2015-155375 A | | 8/2015 |
| JP | 2018-104247 A | | 7/2018 |
| JP | 2018-104248 A | | 7/2018 |
| JP | 2018104248 A | * | 7/2018 |
| JP | 2019-059652 A | | 4/2019 |
| TW | 1447391 B | | 8/2011 |

OTHER PUBLICATIONS

Aug. 6, 2019 Search Report issued in International Patent Application No. PCT/JP2019/022168.

Feb. 9, 2021 International Preliminary Report on Patentability issued in International Patent Application No. PCT/JP2019/022168.

Apr. 7, 2022 Extended Search Report issued in European Patent Application No. 19847282.1.

Jun. 14, 2022 Office Action and Search Report issued in Chinese Patent Application No. 201980050978.X.

Jul. 5, 2022 Office Action issued in Japanese Patent Application No. 2018-150790.

Nov. 7, 2022 Taiwanese Search Report in Patent Application No. 108120019.

Nov. 14, 2022 Office Action issued in Chinese Patent Application No. 201980050978.X.

Jul. 21, 2023 Office Action issued in Singaporean Patent Application No. 11202101068V.

Mar. 24, 2023 Office Action issued in Chinese Patent Application No. 201980050978.X.

* cited by examiner

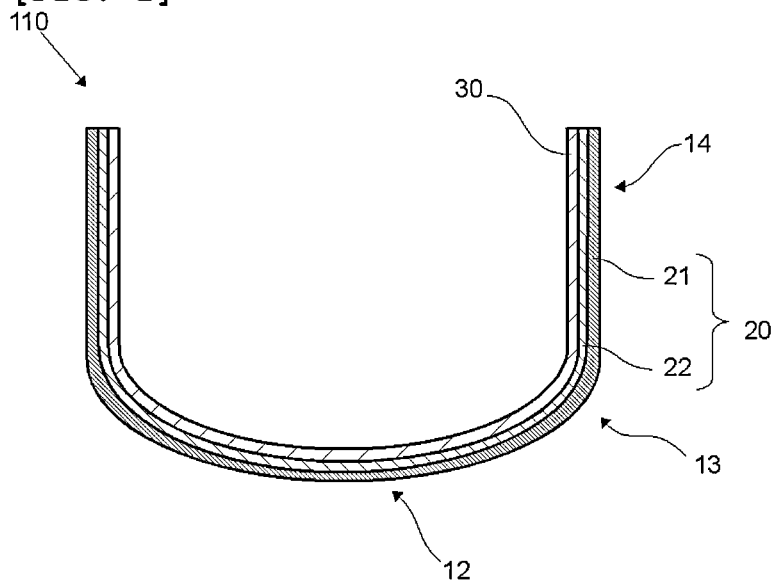
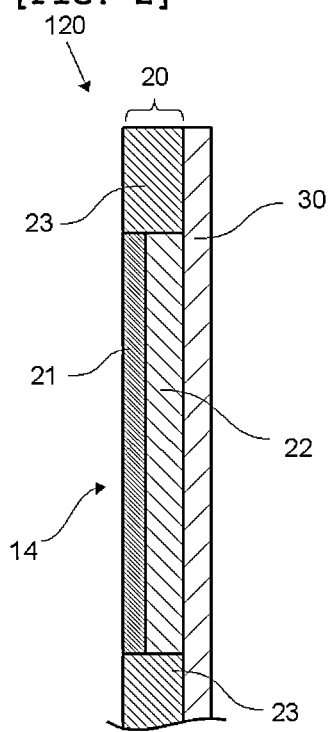

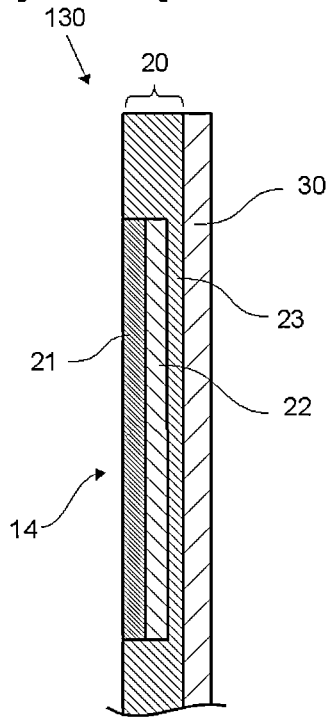
[FIG. 3]
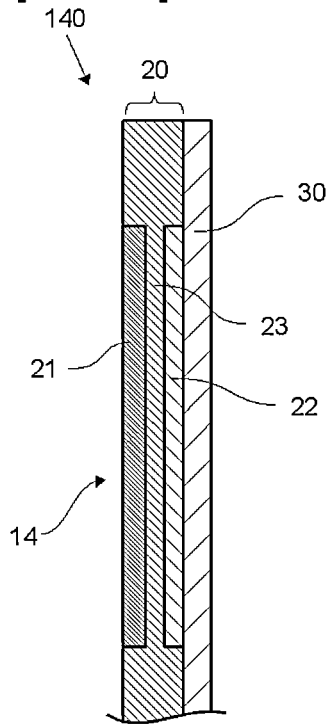
[FIG. 4]

[FIG. 5]
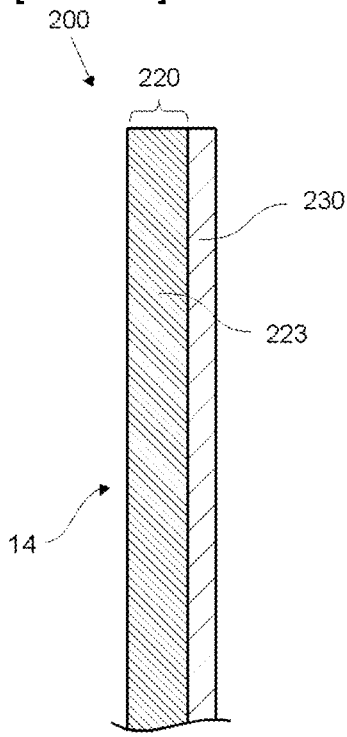
[FIG. 6]
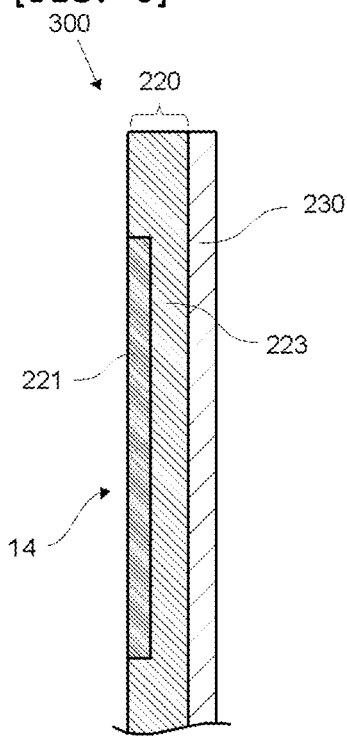
[FIG. 7]
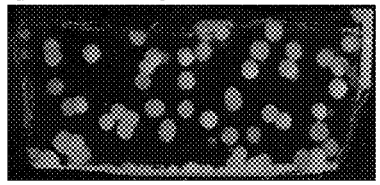

QUARTZ GLASS CRUCIBLE

TECHNICAL FIELD

The present invention relates to a quartz glass crucible.

BACKGROUND ART

Conventionally, the so called Czochralski method has been widely adopted for manufacturing a single crystal material such as a single crystal semiconductor material. This is a method in which polycrystalline silicon is melted in a container, and an end of a seed crystal is dipped into the melt bath (melt) and is pulled with rotation. In this method, a single crystal grows under the seed crystal with having the same crystal orientation. In pulling of a single crystal silicon, a quartz glass crucible is generally used for the container from which the single crystal is pulled. The quartz glass crucible has an outer layer including an opaque quartz glass containing bubbles therein, and an inner layer including a transparent quartz glass containing substantially no bubbles.

In recent years, multi-functionalization of quartz glass crucibles is required with lengthening of operation time of silicon single crystal pulling. Specifically, a deformation problem occurs, where a quartz glass crucible is deformed due to being heated for a long time, and as a countermeasure, the deformation problem can be solved by providing a crystallization promoting layer. For example, Patent Document 1 discloses providing, in an outer layer of a quartz glass crucible, a layer including silica glass having a crystallization promoting agent added. In addition, Patent Document 2 discloses a quartz glass crucible having a 3-layered structure, where the crucible is formed from an outer layer being an Al-added quartz layer, a middle layer being a natural quartz layer or a high-purity synthetic quartz layer, and an inner layer being a transparent high-purity synthetic quartz layer. The contents disclosed in Patent Document 3 includes heating a raw material to be used for a crucible and evaluating devitrification.

CITATION LIST

Patent Literature

Patent Document 1: JP 2008-081374 A
Patent Document 2: JP 2000-247778 A
Patent Document 3: JP 2015-155375 A

SUMMARY OF INVENTION

Technical Problem

As described above, a deformation problem of a quartz glass crucible due to being heated for a long time can be solved by providing a crystallization promoting layer in an outer layer of the crucible. However, if crystallization progresses excessively, devitrification problems arise, such as a devitrification phenomenon progressing excessively, or the devitrification phenomenon progressing in a thickness direction of the crucible. Therefore, suppression of crystallization needs to be dealt with. If the devitrification phenomenon progresses excessively, problems occur such as breakage, for example, a crack occurring in a crucible. Regarding these problems, it is necessary to take conflicting measures in a single quartz glass crucible: crystallization promotion concerning the deformation problem; and crystallization suppression concerning the devitrification problem.

In addition, conventionally, how easily devitrification occurs when a quartz glass crucible is heated has been defined by an impurity concentration of impurity elements such as Al and Ba other than silica. However, it has been revealed by the study of the present inventor that devitrification state sometimes varies even when silica glass having the same impurity concentration is heated under the same heating conditions. For example, Patent Document 1 discloses adding a crystallization promoting agent in an outer layer of a quartz glass crucible as described above, and ease of devitrification is defined by the concentration of the crystallization promoting agent (Al, Ba, Ca, and K). In addition, Patent Document 2 also discloses controlling the extent of crystallization of each layer of a crucible by the Al concentration in each layer of the crucible. However, a high correlation cannot always be obtained between such impurity concentration and degree of devitrification.

The present invention has been made in view of the above-described circumstances, and an object thereof is to provide a quartz glass crucible that can be suppressed from deformation due to heating, and at the same time, can be suppressed from excessive progression of devitrification.

Solution to Problem

The present invention has been made to solve the above problems, and provides a quartz glass crucible comprising a bottom portion, a curved portion, and a straight body portion, wherein the quartz glass crucible comprises an outer layer comprising opaque quartz glass containing bubbles therein, and an inner layer comprising transparent quartz glass, the outer layer comprises a plurality of layers in at least a part of the straight body portion, out of the plurality of layers, at least one layer is an easily devitrifiable layer having a devitrification spot number of $50/cm^3$ or more and $70/cm^3$ or less when the quartz glass crucible is heated at 1600° C. for 24 hours, and out of the plurality of layers, a layer positioned inwards of the easily devitrifiable layer in a thickness direction of the quartz glass crucible is a low devitrification layer having a devitrification spot number of $2/cm^3$ or less when the quartz glass crucible is heated at 1600° C. for 24 hours.

When such a quartz glass crucible has an easily devitrifiable layer in a plurality of layers configuring an outer layer, the layer can be a layer that is easily devitrified when heated. In this manner, the strength of the crucible when heating can be ensured. In addition, at the same time, when a low devitrification layer is provided inwards of the easily devitrifiable layer in the plurality of layers configuring the outer layer, it is possible to prevent excessive progression of devitrification due to the presence of the easily devitrifiable layer. By the presence of these layers, suppression of crucible deformation and suppression of excessive progression of devitrification can both be achieved. In addition, the devitrification state of each of these layers can be controlled certainly by defining by a devitrification spot number.

In this case, the outer layer comprising the plurality of layers preferably comprises, as a layer other than the easily devitrifiable layer and the low devitrification layer, an intermediate devitrification layer having a devitrification spot number of more than $2/cm^3$ and $10/cm^3$ or less when the quartz glass crucible is heated at 1600° C. for 24 hours.

Such a quartz glass crucible having an intermediate devitrification layer in the plurality of layers configuring the outer layer can be made so that the strength of the crucible can be easily enhanced by appropriate devitrification of the intermediate devitrification layer.

Furthermore, out of the plurality of layers of the outer layer, an outermost layer is preferably the easily devitrifiable layer.

In this manner, when, out of the plurality of layers configuring the outer layer, the outermost layer is the easily devitrifiable layer, the outermost layer of the crucible becomes easily devitrifiable. Thus, it becomes easy to maintain the crucible strength high, and at the same time, it can be made easy to suppress propagation of devitrification in a direction towards the inner layer.

Furthermore, the outer layer preferably comprises natural quartz glass, and the inner layer preferably comprises synthetic quartz glass.

In this manner, when the inner layer of the crucible includes synthetic quartz glass, impurity contamination of the contents retained in the crucible can be reduced. At the same time, when the outer layer of the crucible includes natural quartz glass, devitrification density in the outer layer can be appropriately adjusted to maintain strength, and in addition, low cost is possible.

Furthermore, the easily devitrifiable layer preferably has a thickness of 5% or more of a thickness of the quartz glass crucible, the low devitrification layer preferably has a thickness of 20% or more and 70% or less of the thickness of the quartz glass crucible, and the inner layer preferably has a thickness of 5% or more of the thickness of the quartz glass crucible.

In this manner, when the thickness of the easily devitrifiable layer is 5% or more of the thickness of the quartz glass crucible, a portion to be devitrified can be ensured more sufficiently. In addition, when the thickness of the low devitrification layer is 20% or more of the thickness of the quartz glass crucible, propagation of the devitrification that occurs due to the easily devitrifiable layer can be suppressed more effectively. In addition, when the thickness of the low devitrification layer is 70% or less of the thickness of the quartz glass crucible, the strength of the crucible can be ensured more certainly. In addition, when the thickness of the inner layer is 5% or more of the thickness of the quartz glass crucible, the contents of the crucible can be retained appropriately, and at the same time, impurity contamination of the contents can be suppressed more effectively.

Advantageous Effects of Invention

The inventive quartz glass crucible has, in a plurality of layers configuring an outer layer, an easily devitrifiable layer and a low devitrification layer inwards thereof defined by devitrification spot numbers, so that suppression of crucible deformation and suppression of excessive progression of devitrification can both be achieved.

BRIEF DESCRIPTION OF DRAWINGS

FIG. 1 is a schematic cross-sectional view of a first embodiment of a quartz glass crucible according to the present invention.

FIG. 2 is a schematic enlarged cross-sectional view of a second embodiment of a quartz glass crucible according to the present invention.

FIG. 3 is a schematic enlarged cross-sectional view of a third embodiment of a quartz glass crucible according to the present invention.

FIG. 4 is a schematic enlarged cross-sectional view of a fourth embodiment of a quartz glass crucible according to the present invention.

FIG. 5 is a schematic enlarged cross-sectional view of a conventional quartz glass crucible.

FIG. 6 is a schematic enlarged cross-sectional view of a different conventional quartz glass crucible.

FIG. 7 is a photograph of devitrification spots generated in quartz glass.

DESCRIPTION OF EMBODIMENTS

Conventionally, in quartz glass crucibles, it has been common to add a metal impurity such as Al and Ba to a crystallization promoting layer for promoting devitrification. In addition, as disclosed in Patent Document 1 and Patent Document 2, it has been common to define a crystallization promoting layer by the impurity concentration thereof. However, according to a study by the present inventor, it has been revealed that when a different raw material powder (for example, a raw material powder with a different production district, producer, or the like) is used as a raw material powder to be a base, the occurrence state of devitrification sometimes varies even when the impurity concentration is constant. When a raw material quartz powder with an impurity added is vitrified and the quartz glass is heated, a phenomenon called "devitrification" occurs in the form of spots. FIG. 7 shows a photograph of devitrification spots.

For example, when quartz powders 1 to 3 are used as different raw material powders as the raw material powder, Al is added to each quartz powder as a crystallization promoting impurity, and the Al concentration after addition is made to be constant at 50 ppm by mass. However, it has been revealed that the number of generated devitrification spots (number density of devitrification spots) vary even when these raw material powders with the crystallization promoting agent added are heated under the same heating conditions. This is summarized in Table 1.

TABLE 1

| Raw material powder to be a base | Concentration of crystallization promoting impurity [ppm] | Number of generated devitrification spots [number/cm$^3$] |
|---|---|---|
| Quartz powder 1 | 50 | 50 to 60 |
| Quartz powder 2 | 50 | 30 to 40 |
| Quartz powder 3 | 50 | 10 to 20 |

In this manner, it has been revealed that, depending on the raw material powder, there are raw material powders with a low crystallization level, etc. even when the concentration of the crystallization promoting agent is high. When attempting to enhance the strength of a crucible by devitrification, what is important in a crystallization promoted crucible is not the concentration of the promoting agent, but the resulting number of generated crystals (devitrification spots). Therefore, in the present invention, definition of an easily devitrifiable layer and a low devitrification layer by devitrification spot numbers has been found. In this manner, it is possible to control the devitrification state of each layer of the crucible more certainly than is conventional when heating the quartz glass crucible.

As described above, it can be conjectured that the reason why the devitrification spot numbers vary depending on the raw material powder to be a base even when the concentration of the crystallization promoting impurity is the same is that another factor other than a crystallization promoting impurity element such as Al and Ba has an influence. However, the specific reason is unclear. However, in any case, when defined by the devitrification spot number on heating after forming a quartz glass, a configuration necessary for obtaining the effect of ensuring strength in a quartz glass crucible or suppressing excessive progression of devitrification can be defined directly. A devitrification spot number can be easily checked experimentally by performing a heat treatment on a sample at 1600° C. for 24 hours, for example.

In addition, the present inventor has found that by appropriately arranging, in an outer layer of a quartz glass crucible, an easily devitrifiable layer (crystallization promoting layer) for preventing deformation and buckling of the crucible and a low devitrification layer on the inside for preventing the devitrification of the easily devitrifiable layer (crystallization promoting layer) from progressing more than is necessary, suppression of crucible deformation and suppression of excessive progression of devitrification can both be achieved, and completed the present invention.

Hereinafter, the present invention will be more specifically described with reference to the drawings. In each drawing, similar elements will be described using the same reference number.

First Embodiment

FIG. 1 shows a schematic cross-sectional view of an example (first embodiment) of a quartz glass crucible according to the present invention. As shown in FIG. 1, the inventive quartz glass crucible 110 includes a bottom portion 12, a curved portion 13, and a straight body portion 14. The straight body portion 14 refers to a portion of a substantially cylindrical shape in a crucible shape. A region between the straight body portion 14 and the bottom portion 12 is referred to as the curved portion 13. The bottom portion 12 of the crucible can be defined, for example, as a portion having a diameter of approximately two-thirds or less of the outer diameter of the crucible. The height of the straight body portion 14 can be defined, for example, as the upper-three-fourth portion of the height of the crucible, although it depends on the shape of the crucible.

In addition, the quartz glass crucible 110 has an outer layer 20 including opaque quartz glass containing bubbles therein, and an inner layer 30 including transparent quartz glass. The inner layer 30 is a portion that appears transparent since substantially no bubbles are contained. Furthermore, the outer layer 20 of the inventive quartz glass crucible 110 is configured from a plurality of layers in at least a part of the straight body portion 14. FIG. 1 shows an example where the entire outer layer 20 (all of the bottom portion 12, the curved portion 13, and the straight body portion 14) consists of two layers, and the outer layer 20 has the easily devitrifiable layer 21 and the low devitrification layer 22 described below. Furthermore, in the inventive quartz glass crucible 110, out of the plurality of layers configuring the outer layer 20, at least one layer is an easily devitrifiable layer 21 having a devitrification spot number of 50/cm$^3$ or more and 70/cm$^3$ or less when the quartz glass crucible 110 is heated at 1600° C. for 24 hours. In addition, out of the plurality of layers, a layer positioned inwards of the easily devitrifiable layer 21 in a thickness direction of the quartz glass crucible 110 is a low devitrification layer 22 having a devitrification spot number of 2/cm$^3$ or less when the quartz glass crucible 110 is heated at 1600° C. for 24 hours.

The easily devitrifiable layer 21 is, as described above, a layer having a devitrification spot number of 50/cm$^3$ or more and 70/cm$^3$ or less when the quartz glass crucible 110 is heated at 1600° C. for 24 hours. The devitrification spot number can be measured by preparing a sample from the quartz glass crucible after a heat treatment and magnifying with an optical microscope for observation.

Since deformation and buckling of a quartz glass crucible are liable to occur in the straight body portion 14, the easily devitrifiable layer 21 is present in at least a part of the straight body portion 14 of the quartz glass crucible 110, preferably, when the height of the straight body portion is considered to be 100%, in at least 50% or more thereof. However, the easily devitrifiable layer 21 may be present over the entire height of the straight body portion 14, and as shown in FIG. 1, may be present in all of the straight body portion 14, the curved portion 13, and the bottom portion 12. The upper end of the easily devitrifiable layer 21 is preferably present up to a position of the straight body portion 14 higher than the melt surface when a silicon melt is retained in the quartz glass crucible 110. In addition, the lower end of the easily devitrifiable layer 21 is preferably set to be in the curved portion 13, going beyond the straight body portion 14. This is because the strength of the quartz glass crucible 110 when heating can be maintained more effectively by setting to such positions.

As described above, the low devitrification layer 22 is a layer positioned inwards of the easily devitrifiable layer 21 in the thickness direction of the quartz glass crucible 110. In addition, the low devitrification layer 22 is a layer having a devitrification spot number of 2/cm$^3$ or less when the quartz glass crucible 110 is heated at 1600° C. for 24 hours. When the outer layer 20 has a low devitrification layer 22, excessive progression of devitrification due to the presence of the easily devitrifiable layer 21 can be prevented. In this event, the low devitrification layer 22 is preferably positioned to be adjacent to the inside of the easily devitrifiable layer 21 in the thickness direction of the quartz glass crucible 110 as shown in FIG. 1. However, other layers, for example, an intermediate devitrification layer described below may be present between the low devitrification layer 22 and the easily devitrifiable layer 21. In either embodiment, the effect of suppressing the inward progression of devitrification can be achieved.

Furthermore, the outer layer 20 of the inventive quartz glass crucible may have a layer other than the easily devitrifiable layer 21 and the low devitrification layer 22. In particular, in the inventive quartz glass crucible, the outer layer including a plurality of layers preferably has an intermediate devitrification layer as the layer other than the easily devitrifiable layer and the low devitrification layer. The intermediate devitrification layer referred to here is a layer having a devitrification spot number of more than 2/cm$^3$ and 10/cm$^3$ or less when the quartz glass crucible is heated at 1600° C. for 24 hours.

Second Embodiment

In the second embodiment shown in FIG. 2, the quartz glass crucible 120 has an easily devitrifiable layer 21 and a low devitrification layer 22 in a part of the straight body portion 14 out of the outer layer 20. The low devitrification layer 22 is adjacent to the easily devitrifiable layer 21, and is present in a position from the easily devitrifiable layer 21 to the inner layer 30. Furthermore, out of the outer layer 20, an intermediate devitrification layer 23 is present in portions where the easily devitrifiable layer 21 and the low devitrification layer 22 are not present.

In a quartz glass crucible 120 having such a configuration, devitrification occurs in the easily devitrifiable layer 21 when the quartz glass crucible 120 is heated when pulling a silicon single crystal, etc., and the strength of the crucible can be enhanced. At the same time, propagation of the devitrification that occurs in the easily devitrifiable layer 21 can be suppressed by the presence of the low devitrification layer 22, and the quartz glass crucible 120 can be prevented from cracking or breaking.

Third Embodiment

In the third embodiment shown in FIG. 3, the quartz glass crucible 130 has an easily devitrifiable layer 21 and a low devitrification layer 22 in a part of the straight body portion 14 out of the outer layer 20. Furthermore, an intermediate devitrification layer 23 is also present, adjacent to the low devitrification layer 22, in the portion of the straight body portion 14 where the easily devitrifiable layer 21 and the low devitrification layer 22 are present. In addition, in the quartz glass crucible 130, the intermediate devitrification layer 23 is also present in portions where the easily devitrifiable layer 21 and the low devitrification layer 22 are not present.

In a quartz glass crucible 130 having such a configuration, the strength of the crucible is enhanced by promoting the devitrification of the crucible wall by the easily devitrifiable layer 21, while progression and propagation of devitrification are suppressed by the low devitrification layer 22. Here, since devitrification does not easily occur in the low devitrification layer 22 itself, strength of the low devitrification layer 22 itself when heated is weak. Accordingly, the strength of the crucible can be reinforced by the presence of the intermediate devitrification layer 23, and resistance to deformation of the entire quartz glass crucible can be enhanced.

In addition, the outer layer 20 of the inventive quartz glass crucible may further have other layers besides the easily devitrifiable layer 21, the low devitrification layer 22, and the intermediate devitrification layer 23. Furthermore, one layer of each of the easily devitrifiable layer 21 and the low devitrification layer 22 in the thickness direction of the quartz glass crucible is sufficient, but there may also be a plurality of the layers. In cases where an intermediate devitrification layer 23 or other layers are present in the outer layer 20, one layer of each is also sufficient, but there may also be a plurality of the layers.

Fourth Embodiment

In the fourth embodiment shown in FIG. 4, the quartz glass crucible 140 has an easily devitrifiable layer 21 and a low devitrification layer 22 in a part of the straight body portion 14 out of the outer layer 20 in the same manner as the third embodiment. However, in this fourth embodiment, the quartz glass crucible 140 has an intermediate devitrification layer 23 between the easily devitrifiable layer 21 and the low devitrification layer 22. In this case too, the strength of the quartz glass crucible 140 can be enhanced by devitrification occurring in the easily devitrifiable layer 21 by heating. In addition, even if the large amount of devitrification that occurs in the easily devitrifiable layer 21 progresses through the intermediate devitrification layer 23, propagation of the devitrification is suppressed at least by the low devitrification layer 22. In this manner, excessive progression of devitrification in the entire quartz glass crucible 140 can be suppressed.

As shown in FIGS. 1, 2, 3, and 4, out of the plurality of layers of the outer layer 20, the outermost layer is preferably the easily devitrifiable layer 21 in the inventive quartz glass crucibles 110, 120, 130, and 140. When the outermost layer is the easily devitrifiable layer 21 out of the plurality of layers configuring the outer layer 20, the outermost layer becomes easily devitrifiable and it becomes easy to maintain the strength of the crucible high. At the same time, propagation of devitrification towards the inner layer 30 can be made easy to suppress.

In addition, in the inventive quartz glass crucibles 110, 120, 130, and 140, the outer layer 20 preferably includes natural quartz glass, and the inner layer 30 preferably includes synthetic quartz glass. When the inner layer 30 includes synthetic quartz glass, impurity contamination of the contents (silicon melt) retained in the quartz glass crucibles 110, 120, 130, and 140 can be reduced. At the same time, when the outer layer 20 includes natural quartz glass, devitrification density in the outer layer 20 becomes easy to adjust appropriately and strength can be maintained. In addition, low cost is possible.

Furthermore, in the inventive quartz glass crucibles 110, 120, 130, and 140, the easily devitrifiable layer 21 preferably has a thickness of 5% or more of the thickness of the quartz glass crucibles 110, 120, 130, and 140. In this manner, a portion to be devitrified can be ensured more sufficiently in the quartz glass crucibles 110, 120, 130, and 140. In addition, this easily devitrifiable layer 21 further preferably has a thickness of 30% or less of the thickness of the quartz glass crucibles 110, 120, 130, and 140. An easily devitrifiable layer having a thickness of 30% or less of the thickness of the quartz glass crucible can suppress devitrification from progressing excessively. Furthermore, the low devitrification layer 22 preferably has a thickness of 20% or more and 70% or less of the thickness of the quartz glass crucibles 110, 120, 130, and 140. In this manner, propagation of the devitrification that occurs due to the easily devitrifiable layer 21 can be suppressed more effectively, and at the same time, the strength of the crucible can be ensured sufficiently. This low devitrification layer 22 further preferably has a thickness of 20% or more and 60% or less of the thickness of the quartz glass crucibles 110, 120, 130, and 140. Furthermore, the inner layer 30 preferably has a thickness of 5% or more of the thickness of the quartz glass crucibles 110, 120, 130, and 140. In this manner, the contents (silicon melt) of the quartz glass crucibles 110, 120, 130, and 140 can be retained appropriately, and at the same time, impurity contamination of the contents can be suppressed more effectively. The inner layer 30 further preferably has a thickness of 10% or more of the thickness of the quartz glass crucibles 110, 120, 130, and 140.

In addition, when the quartz glass crucible has an intermediate devitrification layer 23 like the quartz glass crucible 130 in FIG. 3, the intermediate devitrification layer 23 preferably has a thickness of 10% or more of the thickness of the quartz glass crucible 130. In this manner, the strength of the quartz glass crucible 130 can be ensured more effectively.

The thickness of each layer configuring the quartz glass crucible can be measured, for example, by cross-sectional observation. That is, the quartz glass crucible can be broken, and the thickness of each layer can be measured from the cross-sectional direction. At this time, the boundary of each layer can be observed using a polarizing plate. In addition, the thickness of each layer becomes easy to measure if each layer is given a bubble density distribution by a difference in the rotational rate of the mold when manufacturing the quartz glass crucible. Alternatively, the thickness of each layer can be observed by performing an analysis of profiles by impurity layer by ICP measurement.

A method for manufacturing the inventive quartz glass crucible will be described. Here, the description will be given with the quartz glass crucible 110 of FIG. 1 and the quartz glass crucible 130 of FIG. 3 as examples.

The inventive quartz glass crucibles 110 and 130 shown in FIGS. 1 and 3 can be manufactured using each raw material powder for the plurality of layers configuring the outer layer 20 and a raw material powder for the inner layer 30. The quartz glass crucibles 110 and 130 can be manufactured by, for example, forming a raw material powder compact inside a rotating mold to correspond to each layer of the quartz glass crucibles 110 and 130 to be manufactured using each raw material powder (raw material quartz powder), and by heating this, etc. from the inside by arc discharge or the like. In addition, the portion corresponding to the outer layer 20 can be formed inside the rotating mold as a raw material powder compact. Then, regarding the inner layer 30, the inner layer 30 can be formed on the inner surface of the outer layer 20 by heat-melting from inside the raw material powder compact for the outer layer by arc discharge, while at the same time, supplying a raw material powder such as a synthetic quartz glass powder into the high temperature atmosphere.

The raw material powder for the easily devitrifiable layer 21 can be prepared by preparing a raw material powder (a raw material powder before performing a doping treatment on) to be the base, and doping this with, for example, a crystallization promoting agent (Al, Ba, etc.). Here, in the present invention, the easily devitrifiable layer 21 is defined by the devitrification spot number under predetermined conditions (heating at 1600° C. for 24 hours) when the quartz glass crucibles 110 and 130 are configured, as described above. This is different from the definition of ease of devitrification by the impurity concentration of impurity elements such as Al and Ba as is conventional. Therefore, the concentration of the crystallization promoting agent in the raw material powder for the easily devitrifiable layer 21 is preferably set according to the devitrification spot number when the easily devitrifiable layer 21 is configured. That is, the impurity concentration can be adjusted by doping the raw material powder for the easily devitrifiable layer 21 with a crystallization promoting agent beforehand, etc. so that the devitrification spot number is $50/cm^3$ or more and $70/cm^3$ or less when the easily devitrifiable layer 21 of the quartz glass crucibles 110 and 130 is formed from a raw material powder, and then heated at 1600° C. for 24 hours. The above-described heat treatment can be performed on the sample fabricated using this raw material, it can be checked whether the devitrification spot number is as desired, and the raw material powder to be used can be selected on the basis of the result. It is also possible to use a raw material powder such that the above-described devitrification spot number can be obtained even when the impurity concentration is not adjusted.

As the raw material powder for the low devitrification layer 22, a raw material powder such that the devitrification spot number is $2/cm^3$ or less when the low devitrification layer 22 of the quartz glass crucibles 110 and 130 is formed from a raw material powder, and then heated at 1600° C. for 24 hours is selected and used.

When the quartz glass crucible has an intermediate devitrification layer 23 like the quartz glass crucible 130 in FIG. 3, a raw material powder such that the devitrification spot number is more than $2/cm^3$ and $10/cm^3$ or less when the intermediate devitrification layer 23 of the quartz glass crucible 130 is formed from a raw material powder, and then heated at 1600° C. for 24 hours is selected and used as the raw material powder for the intermediate devitrification layer 23.

As the raw material powder for the inner layer 30 of the quartz glass crucibles 110 and 130, a synthetic quartz powder is preferably used. In this manner, the inner layer 30 can be a synthetic quartz glass layer.

Each raw material powder described above is disposed in the rotating mold so as to correspond to each layer configuring the outer layer 20 of the quartz glass crucibles 110 and 130 to be manufactured, and heating is performed. When observing the value of the devitrification spot number in quartz glass formed from each raw material powder after heating at 1600° C. for 24 hours, it is possible to measure by fabricating, from each raw material powder, a quartz glass piece to be a sample and performing a heating experiment (at 1600° C. for 24 hours). However, it is preferable to actually fabricate a quartz glass crucible, obtain a sample from each layer after heating at 1600° C. for 24 hours, and measure. This is because the devitrification spot number can be defined to conform to the conditions when the quartz glass crucible is actually fabricated. The devitrification spot number of each layer measured by fabricating a quartz glass crucible in this manner can be considered to be equivalent in each layer formed from the raw material powder of the same lot.

EXAMPLE

Hereinafter, the present invention will be described more specifically with reference to Examples of the present invention and Comparative Examples, but the present invention is not limited to these Examples, and there is no doubt that various modifications can be carried out unless deviating from the technical concept of the present invention.

Example 1

In the following manner, a quartz glass crucible 130 as shown in FIG. 3 was fabricated. As a raw material powder (raw material powder A) for forming an easily devitrifiable layer 21, a raw material powder including a natural quartz powder having a particle size of 50 to 500 μm doped with Al was prepared. The raw material powder (base raw material powder) before doping with Al was a raw material powder whose devitrification spot number when heated at 1600° C. for 24 hours after forming a quartz glass would be $13/cm^3$. The doping amount was adjusted by doping this base raw material powder with Al, so that the devitrification spot number when the Al-doped raw material powder was formed into quartz glass and then heated at 1600° C. for 24 hours would be $50/cm^3$ or more and $70/cm^3$ or less.

In addition, as a raw material powder for forming a low devitrification layer 22, a raw material powder (raw material powder B) including a natural quartz powder whose devitrification spot number would be $1/cm^3$, having a particle size of 50 to 500 μm was prepared. In addition, as a raw material powder for forming an intermediate devitrification layer 23, a raw material powder (raw material powder C) including a natural quartz powder whose devitrification spot number would be 8/cm³, having a particle size of 50 to 500 µm was prepared.

Next, the raw material powder A was supplied to the straight body portion inside a rotating mold having an inner diameter of 830 mm to form a powder layer A (a powder layer to be the easily devitrifiable layer 21) having a thickness of 10 mm. In this event, the powder layer A was formed so that the easily devitrifiable layer 21 of the quartz glass crucible 130 to be manufactured was positioned in a part of the straight body portion 14 as in FIG. 3. Next, the raw material powder B was supplied to the straight body portion inside the mold to form a powder layer B (a powder layer to be the low devitrification layer 22) having a thickness of 10 mm on the inside of the powder layer A. Next, the raw material powder C was supplied to the straight body portion, the curved portion, and the bottom portion inside the mold to form the remaining powder layer C (the powder layer to be the intermediate devitrification layer 23) necessary for formation. In this event, the powder layer C was formed so that the intermediate devitrification layer 23 of the quartz glass crucible 130 to be manufactured was positioned inwards of the low devitrification layer 22 and above and below the easily devitrifiable layer 21 and the low devitrification layer 22 as in FIG. 3.

This compact was heat-melted from inside the compact by arc discharge, while at the same time, a synthetic quartz glass powder was supplied into the high temperature atmosphere at a rate of 100 to 200 g/minute to form, with a thickness of 1 to 3 mm, a transparent glass layer having no bubbles over the entire inner surface area. The quartz glass crucible, the melting having been completed and cooled and having a diameter of 805 to 815 mm, had the top end portion cut so that the height was 500 mm, and the quartz glass crucible 130 was fabricated.

When the quartz glass crucible 130 as described was broken and the thicknesses of the easily devitrifiable layer 21 and the low devitrification layer 22 were measured from a cross-sectional direction, the proportion of the thickness of the easily devitrifiable layer 21 to the thickness of the straight body portion 14 of the quartz glass crucible 130 was about 15%. The proportion of the thickness of the low devitrification layer 22 to the thickness of the straight body portion 14 of the quartz glass crucible 130 was about 40%.

A quartz glass crucible 130 fabricated in the same manner as above was heated at 1600° C. for 24 hours, then the devitrification spot numbers of the easily devitrifiable layer 21, the low devitrification layer 22, and the intermediate devitrification layer 23 were measured. As a result, the devitrification spot numbers were 60/cm³ in the easily devitrifiable layer 21, 1/cm³ in the low devitrification layer 22, and 8/cm³ in the intermediate devitrification layer 23.

Furthermore, a silicon single crystal was pulled using a quartz glass crucible 130 fabricated in the same manner as above, and the operation results were evaluated. As the evaluation of the operation results, resistance to deformation and the devitrification state were evaluated. As the evaluation criteria, regarding resistance to deformation, "Poor" is a case where a deformation that has an effect on operation occurred, "Favorable" is a case where a slight deformation that has no effect on operation was observed, and "Particularly favorable" is a case where deformation was hardly observed during operation. Meanwhile, regarding the devitrification state, "Poor" is a case where the thickness of a devitrified layer (a layer where devitrification progressed and was crystallized) after operation was 60% or more of the thickness of the quartz glass crucible 130. "Favorable" is a case where this thickness was less than 60% of the thickness of the quartz glass crucible 130. "Particularly favorable" is a case where this thickness was less than 50% of the thickness of the quartz glass crucible 130.

In Example 1, no problems were observed in the operation results, and the results were favorable.

The number of layers (sub-layers) configuring the outer layer, the type of the layer defined on the basis of the devitrification spot numbers of the plurality of layers configuring the outer layer, the devitrification spot number, and the type of the inner layer in Example 1 are shown in Table 2. In addition, Table 2 also shows the proportions (hereinafter, also simply referred to as "layer thickness proportions") of the thicknesses of the easily devitrifiable layer 21 and the low devitrification layer 22 to the thickness of the crucible in the quartz glass crucible before operation. In addition, Table 2 shows the evaluation of resistance to deformation and the devitrification state as evaluation of the operation results.

Example 2

A quartz glass crucible was manufactured in the same manner as Example 1, but in the outer layer, the intermediate devitrification layer was disposed as the outermost layer, and the easily devitrifiable layer and the low devitrification layer were disposed inwards thereof. In addition, the devitrification spot number in each layer and the layer thickness proportions of the easily devitrifiable layer and the low devitrification layer were as described in Table 2. The operation results were evaluated as in Example 1, and were as shown in Table 2.

Example 3

A quartz glass crucible was manufactured in the same manner as Example 1, but in the outer layer, the layer thickness proportion of the low devitrification layer 22 was set to 22%. In addition, the devitrification spot number in each layer and the layer thickness proportion of the easily devitrifiable layer were as described in Table 2. The operation results were evaluated as in Example 1, and were as shown in Table 2.

Example 4

A quartz glass crucible was manufactured in the same manner as Example 1, but in the outer layer, the layer thickness proportion of the low devitrification layer 22 was set to 18%. In addition, the devitrification spot number in each layer and the layer thickness proportion of the easily devitrifiable layer were as described in Table 2. The operation results were evaluated as in Example 1, and were as shown in Table 2. The devitrification state was "Favorable", and although devitrification progressed more than in Example 1, this did not become a problem in operation.

Example 5

A quartz glass crucible was manufactured in the same manner as Example 1, but in the outer layer, the layer thickness proportion of the easily devitrifiable layer 21 was set to 5%. In addition, the devitrification spot number in each layer and the layer thickness proportion of the low devitrification layer were as described in Table 2. The operation results were evaluated as in Example 1, and were as shown in Table 2. The progression of devitrification was smaller than in Example 1, but no deformation occurred that became a problem in operation.

Example 6

A quartz glass crucible was manufactured in the same manner as Example 1, but in the outer layer, the layer thickness proportion of the easily devitrifiable layer 21 was set to 35%. In addition, the devitrification spot number in each layer and the layer thickness proportion of the low devitrification layer were as described in Table 2. The operation results were evaluated as in Example 1, and were as shown in Table 2. Devitrification progressed more than in Example 1, but this did not become a problem in operation.

Example 7

A quartz glass crucible was manufactured in the same manner as Example 1, but as a raw material powder for forming a layer corresponding to the intermediate devitrification layer 23 in Example 1, a raw material powder such that devitrification progresses more easily by heating after forming a quartz glass was used. The devitrification spot number in each layer and the layer thickness proportions of the easily devitrifiable layer and the low devitrification layer were as described in Table 2. In the layer corresponding to the intermediate devitrification layer 23 in Example 1, the devitrification spot number was 12. This is higher than the range of the "intermediate devitrification layer" of the present invention, and devitrification progresses more easily than in Example 1 by the heating on pulling the silicon single crystal. Regarding the manufactured quartz glass crucible, the operation results were evaluated as in Example 1, and were as shown in Table 2. The devitrification state was "Favorable", and devitrification progressed more than in Example 1. However, this did not become a problem in operation.

Example 8

A quartz glass crucible was manufactured in the same manner as Example 1, but in the outer layer, the layer thickness proportion of the low devitrification layer 22 was set to 10%. In addition, the devitrification spot number in each layer and the layer thickness proportion of the easily devitrifiable layer were as described in Table 2. The operation results were evaluated as in Example 1, and were as shown in Table 2. The devitrification state was "Favorable", and devitrification progressed more than in Example 1. This can be considered to be due to the low devitrification layer 22 being thin. However, this did not become a problem in operation.

Example 9

A quartz glass crucible was manufactured in the same manner as Example 1, but as a raw material powder for forming a layer corresponding to the intermediate devitrification layer 23 in Example 1, a raw material powder such that devitrification progresses more easily by heating after forming a quartz glass was used. The devitrification spot number in each layer and the layer thickness proportions of the easily devitrifiable layer and the low devitrification layer were as described in Table 2. In the layer corresponding to the intermediate devitrification layer 23 in Example 1, the devitrification spot number was 15. This is higher than the range of the "intermediate devitrification layer" of the present invention, and devitrification progresses more easily than in Example 1 by the heating on pulling the silicon single crystal. Regarding the manufactured quartz glass crucible, the operation results were evaluated as in Example 1, and were as shown in Table 2. The devitrification state was "Favorable", and devitrification progressed more than in Example 1. However, this did not become a problem in operation.

Example 10

The quartz glass crucible 120 shown in FIG. 2 was fabricated. As raw material powder, the raw material powder (raw material powder A) for forming the easily devitrifiable layer 21, the raw material powder (raw material powder B) for forming the low devitrification layer 22, the raw material powder (raw material powder C) for forming the intermediate devitrification layer 23, and the raw material powder for forming the inner layer 30 used in Example 1 were used.

The method for fabricating a raw material powder compact was as follows. Firstly, the raw material powder A was supplied to the straight body portion inside a rotating mold having an inner diameter of 830 mm to form a powder layer A (a powder layer to be the easily devitrifiable layer 21) having a thickness of 10 mm. In this event, the powder layer A was formed so that the easily devitrifiable layer 21 of the quartz glass crucible 120 to be manufactured was positioned in a part of the straight body portion 14 as in FIG. 2. Next, the raw material powder B was supplied to the straight body portion inside the mold to form a powder layer B (a powder layer to be the low devitrification layer 22) having a thickness of 18 mm on the inside of the powder layer A. Next, the raw material powder C was supplied to the regions of the straight body portion, the curved portion, and the bottom portion inside the mold where the powder layers A and B were not formed. Thus, the remaining powder layer C (the powder layer to be the intermediate devitrification layer 23) necessary for formation was formed. In this event, the powder layer C was formed so that the intermediate devitrification layer 23 of the quartz glass crucible 120 to be manufactured was positioned above and below the easily devitrifiable layer 21 and the low devitrification layer 22 as in FIG. 2.

This compact was heat-melted from inside the compact by arc discharge, while at the same time, a synthetic quartz glass powder was supplied into the high temperature atmosphere at a rate of 100 to 200 g/minute to form, with a thickness of 1 to 3 mm, a transparent glass layer having no bubbles over the entire inner surface area. The quartz glass crucible, the melting having been completed and cooled and having a diameter of 805 to 815 mm, had the top end portion cut so that the height was 500 mm, and the quartz glass crucible 120 was fabricated.

When the quartz glass crucible 120 as described was broken and the thicknesses of the easily devitrifiable layer 21 and the low devitrification layer 22 were measured from a cross-sectional direction, the proportion to the thickness of the straight body portion 14 of the quartz glass crucible 120 was about 15% in the easily devitrifiable layer, and about 70% in the low devitrification layer.

A quartz glass crucible 120 fabricated in the same manner as above was heated at 1600° C. for 24 hours, then the devitrification spot numbers of the easily devitrifiable layer 21, the low devitrification layer 22, and the intermediate devitrification layer 23 were measured. As a result, the devitrification spot numbers were 60/cm$^3$ in the easily devitrifiable layer 21, and 1/cm³ in the low devitrification layer 22. In addition, in the intermediate devitrification layer 23 positioned above and below the easily devitrifiable layer 21 and the low devitrification layer 22 as shown in FIG. 2, the devitrification spot number was 7/cm³.

Regarding the manufactured quartz glass crucible 120, the operation results were evaluated as in Example 1, and were as shown in Table 2. Resistance to deformation was "Favorable", and there was more deformation of the crucible than in Example 1, but this did not become a problem in operation.

Example 11

A quartz glass crucible having a configuration where an easily devitrifiable layer is sandwiched between low devitrification layers in the outer layer was fabricated. As raw material powder, the raw material powder (raw material powder A) for forming the easily devitrifiable layer 21, the raw material powder (raw material powder B) for forming the low devitrification layer 22, and the raw material powder for forming the inner layer 30 used in Example 1 were used.

The method for fabricating a raw material powder compact was as follows. Firstly, the raw material powder B was supplied to the straight body portion inside a mold to form a powder layer B (a powder layer to be a low devitrification layer). Next, with the raw material powder A, a powder layer A (a powder layer to be the easily devitrifiable layer) was formed in the straight body portion inside the mold. Furthermore, the raw material powder B was supplied to the straight body portion inside the mold to form the second powder layer B (a powder layer to be a low devitrification layer). Next, the raw material powder C was supplied to the regions of the straight body portion, the curved portion, and the bottom portion inside the mold where the powder layers A and B were not formed. Thus, the remaining powder layer C (the powder layer to be the intermediate devitrification layer) necessary for formation was formed.

This compact was heat-melted from inside the compact by arc discharge, while at the same time, a synthetic quartz glass powder was supplied into the high temperature atmosphere at a rate of 100 to 200 g/minute to form, with a thickness of 1 to 3 mm, a transparent glass layer having no bubbles over the entire inner surface area. The quartz glass crucible, the melting having been completed and cooled and having a diameter of 805 to 815 mm, had the top end portion cut so that the height was 500 mm, and the quartz glass crucible was fabricated.

When the quartz glass crucible as described was broken and the thicknesses of the low devitrification layers were measured from a cross-sectional direction, the proportions of the thicknesses of the low devitrification layers to the thickness of the straight body portion of the quartz glass crucible were each about 35%. In addition, the devitrification spot number in each layer and the layer thickness proportion of the easily devitrifiable layer were as described in Table 2. The operation results were evaluated as in Example 1, and were as shown in Table 2. Resistance to deformation was "Favorable", and there was more deformation of the crucible than in Example 1, but this did not become a problem in operation.

Comparative Example 1

A quartz glass crucible was manufactured with the order of the layers in the outer layer 20 changed from the quartz glass crucible 130 in Example 1. That is, a quartz glass crucible was fabricated with a configuration having an intermediate devitrification layer, a low devitrification layer, and an easily devitrifiable layer from the outer layer. In this case, devitrification progressed excessively in the inner layer as well, since the easily devitrifiable layer was in contact with the inner layer, and the evaluations of the operation results were both "Poor".

Comparative Example 2

A quartz glass crucible was manufactured basically in the same manner as Example 1, but in the outer layer, the doping concentration of Al was reduced in the raw material powder for the layer corresponding to the easily devitrifiable layer 21 in FIG. 3, and the devitrification spot number was adjusted to be less than 50/cm³. In addition, the devitrification spot number in each layer and the layer thickness proportions of the easily devitrifiable layer and the low devitrification layer were as described in Table 2. The operation results were evaluated as in Example 1, and were as shown in Table 2. Resistance to deformation was "Poor", and had an effect on operation results. This can be considered to be because devitrification in the outer layer was insufficient.

Comparative Example 3

A quartz glass crucible was manufactured basically in the same manner as Example 1, but in the outer layer, the doping concentration of Al was increased in the raw material powder for the layer corresponding to the easily devitrifiable layer 21 in FIG. 3, and the devitrification spot number was adjusted to be more than 70/cm³. In addition, the devitrification spot number in each layer and the layer thickness proportions of the easily devitrifiable layer and the low devitrification layer were as described in Table 2. The operation results were evaluated as in Example 1, and were as shown in Table 2. The devitrification state was "Poor", since excessive devitrification occurred due to the layer corresponding to the easily devitrifiable layer.

Comparative Example 4

A quartz glass crucible was manufactured in the same manner as Comparative Example 2, but in addition, in the outer layer, a raw material powder that would become an intermediate devitrification layer (although the raw material powder was such that the devitrification spot number would be less than the third layer from the outermost layer) was used as a raw material powder for the layer corresponding to the low devitrification layer 22 (the second layer from the outermost layer) in FIG. 3. In addition, the devitrification spot number in each layer and the layer thickness proportions of the easily devitrifiable layer and the low devitrification layer were as described in Table 2. The operation results were evaluated as in Example 1, and were as shown in Table 2. Resistance to deformation was "Poor", and had an effect on operation results. This can be considered to be because devitrification in the outer layer was insufficient. The devitrification state was "Favorable", and devitrification progressed more than in Example 1.

Comparative Example 5

A quartz glass crucible was manufactured in the same manner as Comparative Example 3, but in addition, in the outer layer, a raw material powder that would become an intermediate devitrification layer (although the raw material powder was such that the devitrification spot number would be less than the third layer from the outermost layer) was used as a raw material powder for the layer corresponding to the low devitrification layer 22 (the second layer from the outermost layer) in FIG. 3. In addition, the devitrification spot number in each layer and the layer thickness proportion of the easily devitrifiable layer were as described in Table 2. The operation results were evaluated as in Example 1, and were as shown in Table 2. The devitrification state was "Poor", since excessive devitrification occurred due to the layer corresponding to the easily devitrifiable layer.

Comparative Example 6

A quartz glass crucible 200 having the configuration shown in FIG. 5 was manufactured. In this quartz glass crucible 200, an outer layer 220 is entirely configured by an intermediate devitrification layer 223, and an inner layer 230 is formed on the outer layer 220. As raw material powder, the raw material powder for forming the intermediate devitrification layer 23 and the raw material powder for forming the inner layer 30 used in the quartz glass crucible 130 of Example 1 were used.

The devitrification spot number in the outer layer 220 was as described in Table 2. The operation results were evaluated as in Example 1, and were as shown in Table 2. Resistance to deformation was "Poor", and had an effect on operation results. This can be considered to be because devitrification in the outer layer was insufficient.

Comparative Example 7

A quartz glass crucible 300 having the configuration shown in FIG. 6 was manufactured. In this quartz glass crucible 300, the outer layer 220 is configured by an easily devitrifiable layer 221 and an intermediate devitrification layer 223, and an inner layer 230 is formed on the outer layer 220. The quartz glass crucible 300 did not have a low devitrification layer. As raw material powder, the raw material powder for forming the easily devitrifiable layer 21, the raw material powder for forming the intermediate devitrification layer 23, and the raw material powder for forming the inner layer 30 used in the quartz glass crucible 130 of Example 1 were used.

The devitrification spot number in each of the layers configuring the outer layer was as described in Table 2. The operation results were evaluated as in Example 1, and were as shown in Table 2. The devitrification state was "Poor", and had an effect on operation results. This is because devitrification progressed excessively in the outer layer.

TABLE 2

| | | Outer layer | | | | Proportion of easily devitrifiable layer thickness [%] | Proportion of low devitrification layer thickness [%] | Operation results | |
|---|---|---|---|---|---|---|---|---|---|
| | Number of layers configuring outer layer | Outermost layer Devitrification spot number [number/cm³] | Second layer from outside Devitrification spot number [number/cm³] | Third layer from outside Devitrification spot number [number/cm³] | Inner layer | | | Resistance to deformation | Devitrification state |
| Example 1 | 3 | Easily devitrifiable layer 60 | Low devitrification layer 1 | Intermediate devitrification layer 8 | Synthetic layer | 15 | 40 | Particularly favorable | Particularly favorable |
| Example 2 | 3 | Intermediate devitrification layer 6 | Easily devitrifiable layer 55 | Low devitrification layer 2 | Synthetic layer | 20 | 50 | Particularly favorable | Particularly favorable |
| Example 3 | 3 | Easily devitrifiable layer 55 | Low devitrification layer 1 | Intermediate devitrification layer 6 | Synthetic layer | 15 | 22 | Particularly favorable | Particularly favorable |
| Example 4 | 3 | Easily devitrifiable layer 55 | Low devitrification layer 1 | Intermediate devitrification layer 6 | Synthetic layer | 15 | 18 | Particularly favorable | Favorable |
| Example 5 | 3 | Easily devitrifiable layer 65 | Low devitrification layer 1 | Intermediate devitrification layer 5 | Synthetic layer | 5 | 40 | Favorable | Particularly favorable |
| Example 6 | 3 | Easily devitrifiable layer 60 | Low devitrification layer 1 | Intermediate devitrification layer 6 | Synthetic layer | 35 | 40 | Particularly favorable | Favorable |
| Example 7 | 3 | Easily devitrifiable layer 60 | Low devitrification layer 1 | Higher devitrification than intermediate devitrification layer 12 | Synthetic layer | 20 | 40 | Particularly favorable | Favorable |
| Example 8 | 3 | Easily devitrifiable layer 60 | Low devitrification layer 1 | Intermediate devitrification layer 5 | Synthetic layer | 15 | 10 | Particularly favorable | Favorable |
| Example 9 | 3 | Easily devitrifiable layer 60 | Low devitrification layer 2 | Higher devitrification than intermediate devitrification layer 15 | Synthetic layer | 20 | 40 | Particularly favorable | Favorable |
| Example 10 | 2 | Easily devitrifiable layer 60 | Low devitrification layer 1 | — | Synthetic layer | 15 | 70 | Favorable | Particularly favorable |

TABLE 2-continued

| | Number of layers configuring outer layer | Outer layer | | | Inner layer | Proportion of easily devitrifiable layer thickness [%] | Proportion of low devitrification layer thickness [%] | Operation results | |
|---|---|---|---|---|---|---|---|---|---|
| | | Outermost layer Devitrification spot number [number/cm³] | Second layer from outside Devitrification spot number [number/cm³] | Third layer from outside Devitrification spot number [number/cm³] | | | | Resistance to deformation | Devitrification state |
| Example 11 | 3 | Low devitrification layer 1 | Easily devitrifiable layer 60 | Low devitrification layer 1 | Synthetic layer | 15 | 70 (35% each) | Favorable | Particularly favorable |
| Comparative Example 1 | 3 | Intermediate devitrification layer 8 | Low devitrifiable layer 1 | Easily devitrifiable layer 60 | Synthetic layer | 15 | 40 | Poor | Poor |
| Comparative Example 2 | 3 | Lower devitrification than easily devitrifiable layer 45 | Low devitrification layer 2 | Intermediate devitrification layer 3 | Synthetic layer | 15 | 40 | Poor | Particularly favorable |
| Comparative Example 3 | 3 | Higher devitrification than easily devitrifiable layer 75 | Low devitrification layer 2 | Intermediate devitrification layer 3 | Synthetic layer | 15 | 40 | Particularly favorable | Poor |
| Comparative Example 4 | 3 | Lower devitrification than easily devitrifiable layer 45 | Intermediate devitrification layer 3 | Intermediate devitrification layer 7 | Synthetic layer | 15 | 0 | Poor | Favorable |
| Comparative Example 5 | 3 | Higher devitrification than easily devitrifiable layer 80 | Intermediate devitrification layer 3 | Intermediate devitrification layer 7 | Synthetic layer | 15 | 0 | Particularly favorable | Poor |
| Comparative Example 6 | 1 | Intermediate devitrification layer 7 | — | — | Synthetic layer | 0 | 0 | Poor | Particularly favorable |
| Comparative Example 7 | 2 | Easily devitrifiable layer 60 | Intermediate devitrification layer 7 | — | Synthetic layer | 15 | 0 | Particularly favorable | Poor |

It was revealed from the results of Examples 1 to 11 and Comparative Examples 1 to 7 that by the presence of an easily devitrifiable layer and a low devitrification layer positioned inwards thereof defined by devitrification spot numbers, suppression of crucible deformation and suppression of excessive progression of devitrification can both be achieved.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A quartz glass crucible comprising a bottom portion, a curved portion, and a straight body portion, wherein
   the quartz glass crucible comprises an outer layer comprising opaque quartz glass containing bubbles therein, and an inner layer comprising transparent quartz glass,
   the outer layer comprises a plurality of layers in at least a part of the straight body portion,
   out of the plurality of layers, at least one layer is an easily devitrifiable layer having a devitrification tendency defined by a devitrification spot number of 50/cm³ or more and 70/cm³ or less as measured by heating the quartz glass crucible at 1600° C. for 24 hours, and
   out of the plurality of layers, a layer positioned inwards of the easily devitrifiable layer in a thickness direction of the quartz glass crucible is a low devitrification layer having a devitrification tendency defined by a devitrification spot number of 2/cm³ or less as measured by heating the quartz glass crucible at 1600° C. for 24 hours.

2. The quartz glass crucible according to claim 1, wherein the outer layer comprising the plurality of layers comprises, as a layer other than the easily devitrifiable layer and the low devitrification layer, an intermediate devitrification layer having a devitrification tendency defined by a devitrification spot number of more than 2/cm³ and 10/cm³ or less as measured by heating the quartz glass crucible at 1600° C. for 24 hours.

3. The quartz glass crucible according to claim 2, wherein out of the plurality of layers of the outer layer, an outermost layer is the easily devitrifiable layer.

4. The quartz glass crucible according to claim 3, wherein the outer layer comprises natural quartz glass, and the inner layer comprises synthetic quartz glass.

5. The quartz glass crucible according to claim 4, wherein the easily devitrifiable layer has a thickness of 5% or more of a thickness of the quartz glass crucible, and
   the low devitrification layer has a thickness of 20% or more and 70% or less of the thickness of the quartz glass crucible.

6. The quartz glass crucible according to claim 2, wherein the outer layer comprises natural quartz glass, and the inner layer comprises synthetic quartz glass.

7. The quartz glass crucible according to claim 6, wherein
the easily devitrifiable layer has a thickness of 5% or more of a thickness of the quartz glass crucible, and
the low devitrification layer has a thickness of 20% or more and 70% or less of the thickness of the quartz glass crucible.

8. The quartz glass crucible according to claim 2, wherein
the easily devitrifiable layer has a thickness of 5% or more of a thickness of the quartz glass crucible, and
the low devitrification layer has a thickness of 20% or more and 70% or less of the thickness of the quartz glass crucible.

9. The quartz glass crucible according to claim 3, wherein
the easily devitrifiable layer has a thickness of 5% or more of a thickness of the quartz glass crucible, and
the low devitrification layer has a thickness of 20% or more and 70% or less of the thickness of the quartz glass crucible.

10. The quartz glass crucible according to claim 1, wherein out of the plurality of layers of the outer layer, an outermost layer is the easily devitrifiable layer.

11. The quartz glass crucible according to claim 10, wherein the outer layer comprises natural quartz glass, and the inner layer comprises synthetic quartz glass.

12. The quartz glass crucible according to claim 11, wherein
the easily devitrifiable layer has a thickness of 5% or more of a thickness of the quartz glass crucible, and
the low devitrification layer has a thickness of 20% or more and 70% or less of the thickness of the quartz glass crucible.

13. The quartz glass crucible according to claim 10, wherein
the easily devitrifiable layer has a thickness of 5% or more of a thickness of the quartz glass crucible, and
the low devitrification layer has a thickness of 20% or more and 70% or less of the thickness of the quartz glass crucible.

14. The quartz glass crucible according to claim 1, wherein the outer layer comprises natural quartz glass, and the inner layer comprises synthetic quartz glass.

15. The quartz glass crucible according to claim 14, wherein
the easily devitrifiable layer has a thickness of 5% or more of a thickness of the quartz glass crucible, and
the low devitrification layer has a thickness of 20% or more and 70% or less of the thickness of the quartz glass crucible.

16. The quartz glass crucible according to claim 1, wherein
the easily devitrifiable layer has a thickness of 5% or more of a thickness of the quartz glass crucible, and
the low devitrification layer has a thickness of 20% or more and 70% or less of the thickness of the quartz glass crucible.

* * * * *